(12) United States Patent
Zhou et al.

(10) Patent No.: US 8,666,706 B2
(45) Date of Patent: Mar. 4, 2014

(54) MATERIAL PROPERTY DISTRIBUTION DETERMINATION FOR FATIGUE LIFE CALCULATION USING DENDRITE ARM SPACING AND POROSITY-BASED MODELS

(75) Inventors: Xinyu Zhou, Troy, MI (US); Paul N. Crepeau, Clawson, MI (US); Bing Li, Rochester Hills, MI (US); Qigui Wang, Rochester Hills, MI (US); Arunkumar R, Gummidipundi TK Tiruvallur DT (IN)

(73) Assignee: GM Global Technology Operations LLC, Detroit, MI (US)

( * ) Notice: Subject to any disclaimer, the term of this patent is extended or adjusted under 35 U.S.C. 154(b) by 454 days.

(21) Appl. No.: 12/932,858

(22) Filed: Mar. 8, 2011

(65) Prior Publication Data
US 2012/0232858 A1    Sep. 13, 2012

(51) Int. Cl.
G06F 17/10    (2006.01)

(52) U.S. Cl.
USPC ............... 703/2; 266/237; 266/276; 700/97; 700/98; 700/104

(58) Field of Classification Search
None
See application file for complete search history.

(56) References Cited

U.S. PATENT DOCUMENTS

| | | | |
|---|---|---|---|
| 2006/0282186 A1* | 12/2006 | Hansen et al. | 700/97 |
| 2009/0276166 A1* | 11/2009 | Wang et al. | 702/34 |
| 2010/0030537 A1 | 2/2010 | Wang et al. | |
| 2011/0144788 A1 | 6/2011 | Wang et al. | |

OTHER PUBLICATIONS

Helmut Dannbauer, Christian Gaier, Werner Aichberger Integrating the Results from Process Simulation into Fatigue Life Prediction SAE Technical Paper No. 2007-26-071, 2007, Citeseer.*
R.W. Halmiton, D. See, S. Butler, P.D. Lee Multiscale Modleing for the Prediction of Casting Defects in Investment Cast Aluminum Alloys Materials Science and Engineering A 343, 2003, pp. 290-300.*
P. Li, D.M. Maijer, T.C. Lindley, P.D. Lee A through process model of the inpact of in-service loading, residual stress, and microstructure on the final fatigue life of an A356 automotive wheelMaterials Science and Engineering A 460-461, 2007, pp. 20-30.*

* cited by examiner

Primary Examiner — Saif Alhija
Assistant Examiner — Cuong Luu
(74) Attorney, Agent, or Firm — Dinsmore & Shohl LLP

(57) ABSTRACT

A method to predict a distribution of material properties of a cast component. In one form, the method includes accepting at least one of dendrite arm spacing data and porosity data that have been previously determined, as well as accepting casting geometry data and structural analysis geometric data, calculating material properties of the casting based on one or both of dendrite arm spacing data and porosity data at each of the various nodes within the casting FEA or FD mesh and mapping the calculated material properties to the various nodes of the finished part FEA mesh. The method may be used as a basis for conducting fatigue or a related durability analysis on the component.

18 Claims, 14 Drawing Sheets
(8 of 14 Drawing Sheet(s) Filed in Color)

| Component C, Supplier 1, Process i | | |
|---|---|---|
| | Location 1 | Location 2 |
| UTS, MPa | 240 | 160 |
| Fatigue Strength, MPa | 92 | 32 |

FIG. 4B

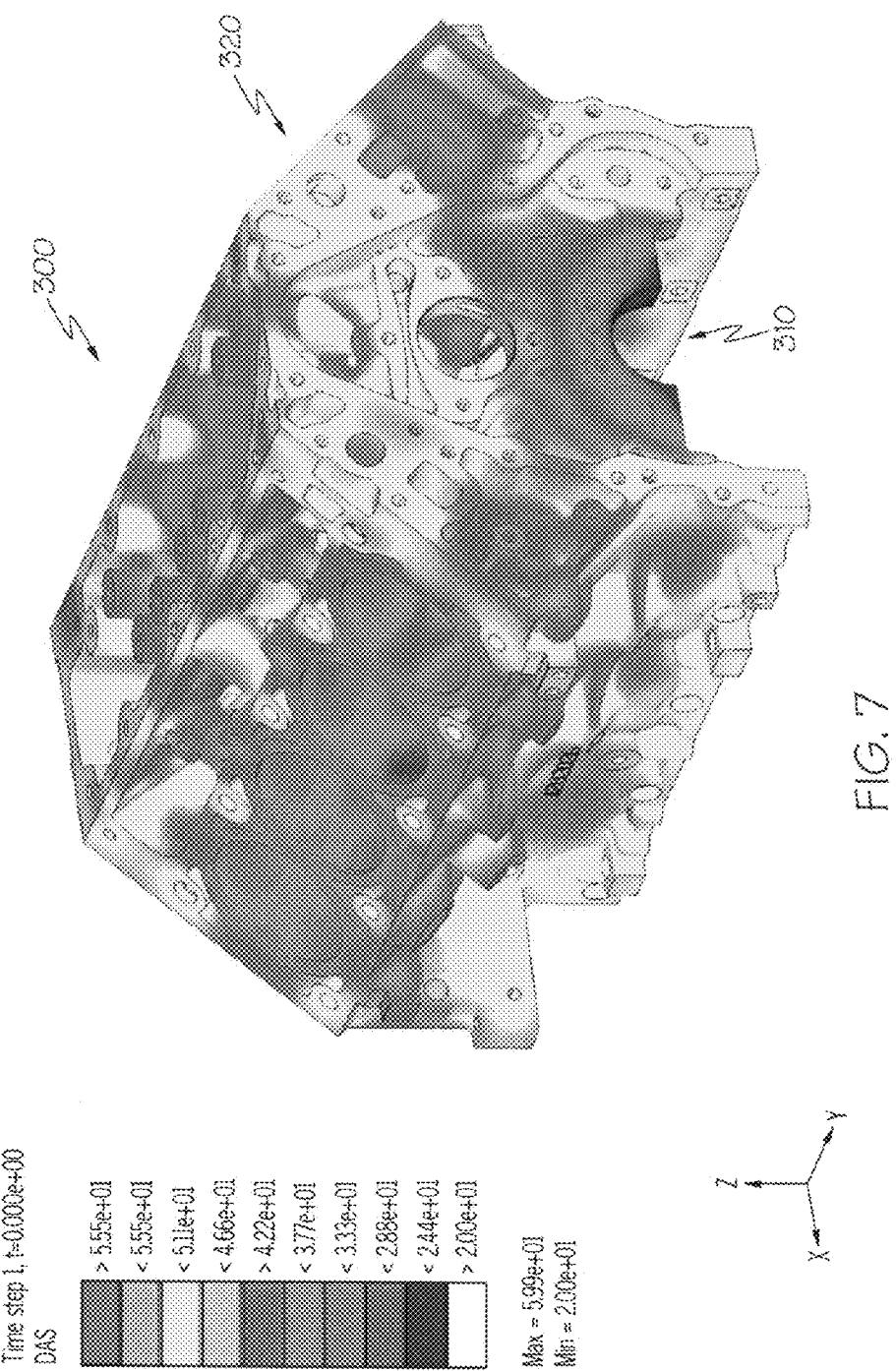

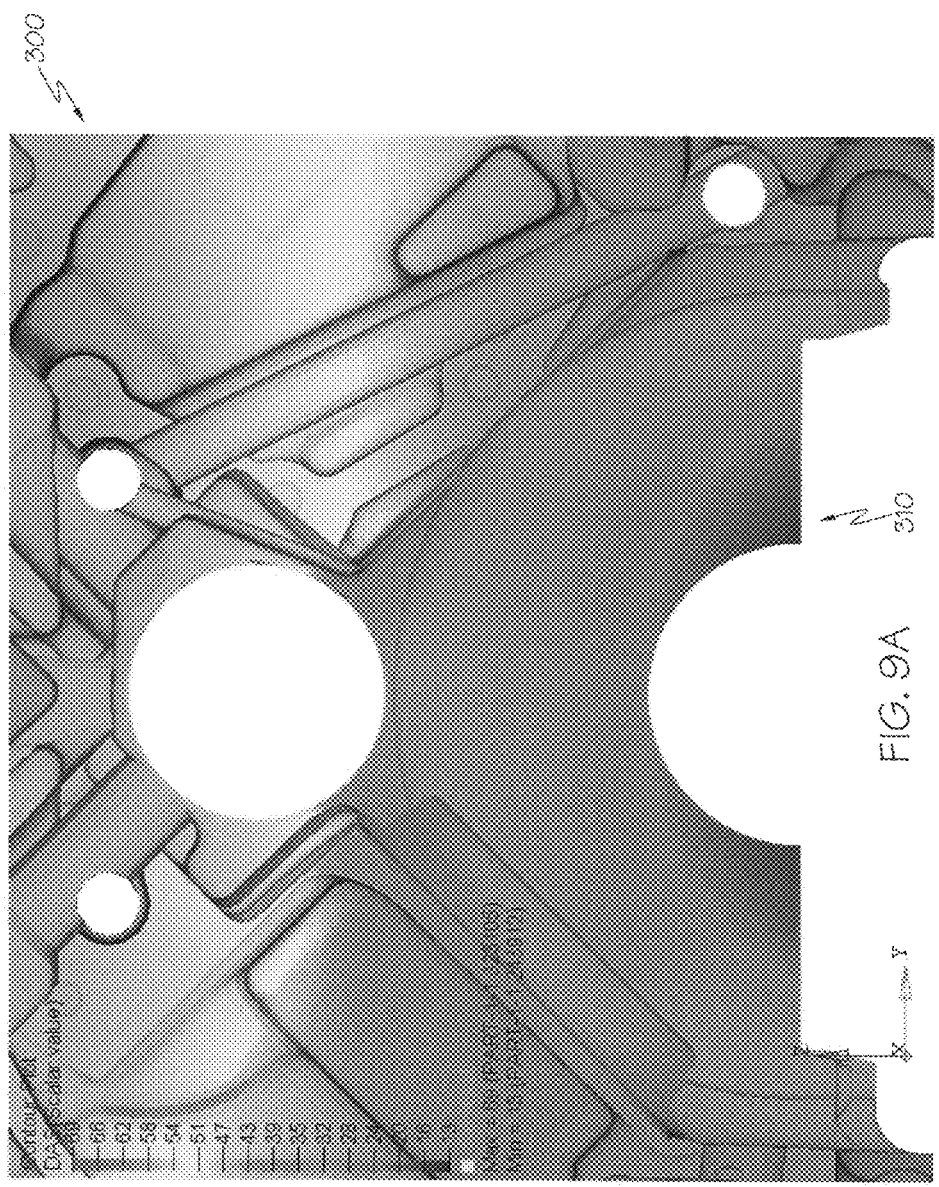

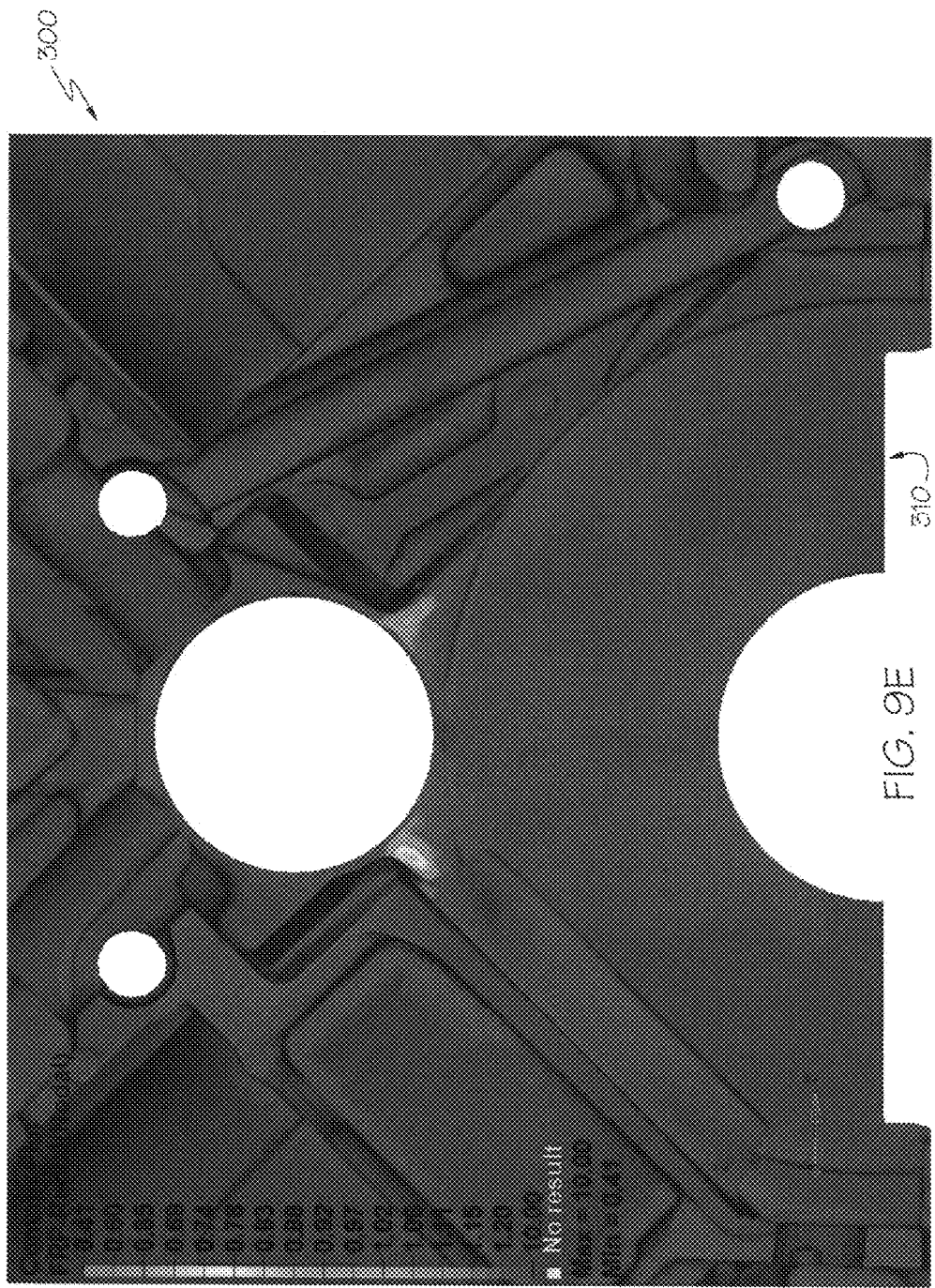

MATERIAL PROPERTY DISTRIBUTION DETERMINATION FOR FATIGUE LIFE CALCULATION USING DENDRITE ARM SPACING AND POROSITY-BASED MODELS

BACKGROUND OF THE INVENTION

The present invention relates generally to the predicted mechanical properties of cast components and, more particularly to systems, methods, and articles of manufacture to help predict tensile properties and fatigue lives of cast aluminum alloys by determining the distribution of material properties throughout cast components based on casting process simulation that accounts for one or both of dendrite arm spacing (DAS) values and porosity values.

Numerical simulation (such as finite element analysis (FEA, sometimes abbreviated FE) and finite difference (FD)) techniques are used to predict thermal, mechanical and related behavior of an object to be simulated by breaking up large, often complex, objects into discrete simple shapes that are assumed to possess mathematically homogeneous properties. Certain properties, for example, the material properties, are conventionally assumed to be substantially uniform through the object being simulated. Unfortunately, many such objects do not exhibit such uniformity in their material properties. This is particularly prevalent with cast components, where (for example) DAS has been shown to have a significant impact on such material properties, as the material with smaller DAS tends to have better mechanical properties. With regard to automotive engine blocks, DAS values, which provide indicia of solidification rates of cast components, have a tendency to be comparatively low in thin regions or the regions with chills (such as the block's bulkhead), and relatively high in the thicker regions (such as those adjacent the block's head bolt bosses). As such, durability analysis and life prediction (such as fatigue analysis or simulation; or fatigue life prediction) of cast components can be compromised without correction for such material variations.

Regarding DAS-based tensile and fatigue property modelling, the inherent variation in casting properties results at least in part because directional solidification required to feed solidification shrinkage requires temperature gradients that cause differences in solidification rate and time. Since microstructure is sensitive to solidification rate and time, and properties are sensitive to microstructure, a so-called "good" casting design will always produce a gradient of properties. Conventional solidification analysis software reports mechanical properties for various cast metal alloys only in the as-cast condition, or is used to determine microstructure based on a functional relationship with empirical measurements that in turn is used to predict mechanical properties based on the results of solidification simulation combined with specific geometrical and processing inputs.

Because all cast parts are processed to some extent differently, based in part on metal preparation (including, for example, hydrogen and inclusion content), particular casting process features (such as chill or no chill), post cast cooling, heat treatment, geometry or the like, each casting is led through a development cycle ending in a unique set of properties. Further, predicting properties from fundamental principles is very computationally intensive. In one form of fatigue modeling or calculation software, the material property database lists factors that reduce or increase the nominal fatigue strength based on the local microstructural parameter DAS. The software reads a file containing the DAS value at each node in an FEA mesh, and then computes an adjusted fatigue strength at each node. Such a solution fails to show how fatigue strength is controlled by DAS, instead showing how fatigue strength is controlled by porosity content, which only weakly correlates with DAS.

As such, systems, methods and articles of manufacture to accurately account for material property variations of cast components are lacking. Likewise, finite element and related stress analysis could benefit by providing a more realistic field of mechanical properties at each node in the FEA mesh of a cast component as a way to improve simulation accuracy.

SUMMARY OF THE PRESENT INVENTION

The present invention enables more accurate prediction of durability and performance of cast components by taking into consideration material property variations throughout the component. The present invention allows a modeler to combine standard properties from a material property database with DAS or solidification time data outputted from a solidification simulation, as well as to map the properties into an FEA mesh in a straightforward manner. In the present context, mapping includes taking data (such as DAS or the like) outputted from the solidification simulation at each node in the casting FEA or FD mesh and coupling it into the finished part FEA mesh. This is not straightforward because (as discussed below) node coordinates and geometric juxtaposition are different in the two meshes, as are the overall part geometries. In this way, seed data that pertains to specific DAS or porosity values of a cast component being modeled is used to calculate properties throughout the component based on the local DAS or porosity value.

In accordance with one embodiment, a method of predicting a distribution of material properties within such a cast component is disclosed so that variations in material properties are mapped throughout the component. The method includes accepting one or both of DAS and porosity data, where such data has been determined from a calculation configured to provide at least one of casting quality data, casting defect data and material microstructure data. An example of something that can provide such a calculation is casting process simulation software (also called casting modeling, casting simulation or the like). Commercially-available examples of such casting process simulation include MAGMA, ProCAST, EKK, WRAFTS, Anycasting, or the like. Such software typically has several modules that can simulate casting mold filling, solidification, core molding (blowing) and related functions, which combine to determine the distribution of microstructures in a casting. The present inventors used MAGMA to provide DAS data for the castings of interest. The method additionally includes accepting nodal numbers as well as their corresponding nodal coordinates (for example, x, y and z coordinates from a Cartesian coordinate system) from the casting simulation. The present inventors also coupled solidification results and additional parameters into a casting defect simulation code to predict pore sizes. In the present context, a casting defect simulation code generally uses the results of a solidification simulation (such as the progression of temperature change during cooling and related density changes from liquid to solid) as an input to compute details such as the nucleation and growth of porosity. This casting defect simulation code is the subject of a related application, herein incorporated by reference in its entirety, entitled METHOD FOR SIMULATING CASTING DEFECTS AND MICROSTRUCTURES OF CASTINGS that was filed on Dec. 16, 2009, given USPTO patent application filing Ser. No. 12/653,606 and owned by the Assignee of the present invention. The method also includes accepting casting geometry data where such geometry data is used to correspond various nodes of an FEA or FD mesh comprising a geometric representation of the cast component with respective coordinates in a three-dimensional coordinate system. For example, it can have each of the nodes correspond to a unique {x, y, z} coordinate within a Cartesian coordinate system. The method also includes calculating material properties of the casting at the various nodes by taking into consideration one or both of the solidification time and solidification rate (which may in turn be used to provide DAS and porosity data), and also mapping the calculated material properties to the nodes within the FEA mesh. In the present context, the calculated material properties may include mechanical properties (such as tensile and fatigue properties). Likewise in the present context, mapping the DAS and porosity data from the casting FEA or FD mesh to a finished part FEA mesh means to find the DAS and porosity values for every node in the finished part FEA mesh from the casting FEA or FD mesh. Mapping the DAS and property values outputted from the casting simulation into the finished part FEA mesh is not trivial because (1) geometries differ since metal is machined from the casting to make the finished part and (2) meshes differ for structural FEA and solidification simulation. For instance, Magma uses an FD mesh composed of identical cubic elements; FEA structural analysis codes typically use a mesh of irregularly sized tetrahedral elements.

To transfer results from the mesh of the casting simulation code to the mesh of the structural analysis code, best matches must be found between coordinates of respective nodes. Inevitable differences between coordinates must be reconciled. Part of the method described herein covers such reconciliation. Another part relates to using the solidification results as transferred to the structural analysis code mesh as input to equations for calculation of mechanical properties. In this way the distributed solidification result values are used to map nodewise properties throughout the structural analysis code mesh.

A portion of the method according to one aspect of the present invention performs two main functions: (1) mapping nodal values of DAS, porosity and/or data from a solidification simulation into a finished part FEA mesh and correcting errors that may arise out of differences between nodal mesh geometries, and (2) calibrating a mapping equation with data from a material property database and using the calibrated equation to calculate nodal properties throughout the part based on nodal solidification time, solidification rate, DAS or porosity. This mapping and calibrating function (sometimes referred to herein as MATerial GENeration, or MATGEN) includes, as part of its first function, reading the node number and corresponding nodal coordinates (such as the aforementioned {x, y, z} coordinates in a Cartesian system). In addition, MATGEN reads DAS, porosity or solidification information from the data file outputted from the casting process simulation code. Meanwhile, MATGEN reads in the node number, nodal coordinates and element connectivity of the structural FEA mesh. For each node in the structural FEA mesh, MATGEN searches the corresponding node in the casting FEA or FD mesh, where the element connectivity is used to accelerate the searching process. In an option form to MATGEN, if one node of the element is far away from the target node, the code can instruct the rest of the nodes in the elements to not be searched. If the corresponding node doesn't exist, the program will use the element connectivity information to find a set of nodes nearby to interpolate the DAS and porosity values. In one form, a method according to an aspect of this invention permits solidification simulation data to be mapped to a finished part FEA mesh after which properties in the finished part FEA mesh may be calculated or mapped based on the local DAS, porosity or related values. The present inventors have recognized that the order that these two functions proceed in are not critical for proper computation, and as such may be reversed such that the calculation of properties based on solidification result data could be done in the solidification mesh, after which the calculated properties at each solidification mesh node could be mapped into the finished part mesh. In the second of these functions, when the corresponding node number and the respective DAS and porosity data for the structural FEA mesh are obtained, the mechanical properties for each node are then calculated from equations relating, for instance, DAS and porosity to mechanical properties and outputted to a result file with the respective node number and {x, y, z} coordinates. This result file may then be used as the input file of nodal material properties for the structural FEA analysis to precisely calculate the fatigue life at each node in the part.

In one optional form, the mapped approximated material properties corresponding to the respective nodal coordinates of the finished part mesh simulation are combined with the determined stresses and strains prior to conducting the fatigue analysis, while in another the mapped approximated material properties are introduced separately into the fatigue analysis from the determined stresses and strains. Stated another way, the mesh integration and mapping under MATGEN may have their orders reversed, depending on whether the MATGEN mapping is merged with the nodal stresses and strains. In the situation where the mapping under MATGEN is performed first, the nodal DAS and related numbers in the solidification mesh are transformed into nodal properties, after which they are mapped or otherwise integrated into the finished part mesh. Thus, in one form, solidification simulation data may be mapped to a finished part FEA mesh after which properties in the finished part FEA mesh may be calculated or mapped based on the local DAS, porosity or related values.

As presently configured, the program can use the DAS data to predict both fatigue and tensile properties, while the porosity data can be used to predict only fatigue, albeit as a better predictor of fatigue than DAS. In the present context, a model is understood to be a calculation based on a mathematical representation of a set of data that can be used to determine the effect that a particular process (such as a casting process) has on mechanical properties of an object being studied. Such a model may include an algorithm, program or related computation that can be performed, run or otherwise conducted in order to produce the resulting data representation. In a preferred form, the model can be run on a digital computer. As will be appreciated by those skilled in the art, a data processing or computer system in general, and a digital computer in particular, preferably include an input, an output, a processing unit (often referred to as a central processing unit (CPU)) and memory that can temporarily or permanently store such a code, program or algorithm in the computer's memory such that the instructions contained in the code are operated upon by the processing unit based on input data such that output data generated by the code and the processing unit can be conveyed to another program or a user via output. In one form, a data-containing portion of the memory (also called working memory) is referred to as random access memory (RAM), while an instruction-containing portion of the memory (also called permanent memory is referred to as read only memory (ROM). A data bus or related set of wires and associated circuitry forms a suitable data communication path that can interconnect the input, output, CPU and memory, as well as any peripheral equipment in such a way as to permit the system to operate as an integrated whole. Such a computer system is referred to as having a von Neumann architecture (also referred to as a general purpose or stored-program computer).

The output information from MATGEN can be read by a structural (including fatigue) analysis code or a computer-aided design (CAD) code (examples of which include FES-AFE, ABAQUS or Hypermesh) to show the calculated properties at each node. In one example, the method of the current program can generate a Hypermesh visualization file by mapping the calculated material properties to an FEA mesh in a text format. This visualization file can then be read in to show the properties for each node, employing a readily-perceptible indicia, such as by color contours or the like. Similarly, MATGEN can also map the input DAS and porosity data onto an FEA mesh.

Optionally, the method includes using both the DAS and porosity values. In a preferred form, accepting both casting geometry data and one or both of DAS and porosity data includes additionally mapping such data to the various nodes within a geometric model commonly represented by an FEA mesh. In another option, the aforementioned combining casting simulation results with the three-dimensional coordinate system geometric model comprises receiving casting simulation results from a previously-performed casting simulation and combining these results with respective coordinates from the geometric model. In another option, the combining may involve having the casting simulation results be generated ahead of time (such as through the use of a stand-alone casting process simulation) and then importing such results into the method to combine with the nodal representation of the shape, geometry or related structural attributes of the cast component. As stated above, the three-dimensional coordinate system may be used to represent a conventional $\{x, y, z\}$ Cartesian coordinate system. The method may further comprise conducting a structural analysis of the casting based on the mapping the calculated material properties in order to determine at least one of fatigue and tensile properties thereof.

The method may further be configured such that different models may rely upon different forms of material property information from the material property database. For example, a first set of material property information may be needed for the solidification simulation calculations involving time and rate, while a second set of material property information may be used for the nodal coordinates of the finished part structural analysis. Likewise, some of the material property information may be common such that there is overlap in the two sets. In one form, the solidification simulation may use thermophysical data for the alloy (such as Cp, thermal conductivity, heat of fusion, viscosity or the like), while the structural analysis may use stress-strain behavior-related criteria (such as elastic modulus, nu, stress-strain curve, coefficient of thermal expansion or the like) and the fatigue analysis relying upon failure criteria (such as yield strength, ultimate tensile strength, S-N curve data, strain-life fatigue data or the like). In the present case, the failure criteria property data are defined in the material property database for a limited number (commonly, two) locations; the method of the present application includes assigning calculated failure criteria property data to other locations within the finished part undergoing structural analysis. In another form, it may be possible to conduct the property mapping in such a way as to map nodal values of stress-strain behavior.

According to another aspect of the invention, a method of conducting a fatigue analysis for a cast component is disclosed. Such an analysis serves as a useful way to predict where areas of stress in a cast component may be both high enough and repeated often enough such that over time they lead to failure of the component. The stress-life method (which employs the well-known S-N curve) is a widely-used approach to determining fatigue in the automotive and related industries, where such approach may include time domain and frequency domain variants. In addition to domains, fatigue analysis may be based on numerous other factors, such as on crack initiation and propagation (using either uniaxial or multiaxial stress loading assumptions, for example) as a way to show how the poor transmission of stress developed at local discontinuities can lead to fatigue failure. In the present context, a micromechanics-based fatigue life analysis, model, calculation or the like is one that preferably employs a digital computer (such as discussed above) to use a finite element or related nodal approach to simulate behavior of a part, where "micromechanics" refers generally to mathematical calculations based on one or more individual phases or chemical components that cumulatively constitute an alloy or composite. As such, the micromechanics-based fatigue life models (i.e., equations) described herein consider the likelihood of the occurrence of defects and microstructure characteristics in the aluminum alloy when predicting a fatigue life of the aluminum alloy under multiaxial loading thereof. The method includes determining a material property distribution within a casting, providing fatigue-related parameter input into a fatigue analysis method and calculating one or more fatigue properties of the component. The material property distribution can be determined by combining casting simulation results from a previous casting process simulation with a multidimensional thermal-structure simulation to produce a mapping of the material properties of the component being cast, and combining it with one or more of DAS and porosity values that have been used for a respective material property calculation. From this, a distribution of material properties within the mapping is performed by applying the appropriate DAS or porosity values to the casting simulation results, after which the distribution of material properties can be input into a structural simulation with service load in order to conduct a fatigue durability analysis where one or more fatigue durability values such as safety factor associated with the cast component based on the distribution of material properties can be determined.

Optionally, the DAS-based material properties equations can be simply calibrated using measured material properties at two locations of the part that exhibit different DAS values. One such component that the device and method of the present invention may be particularly applicable to is an engine block, where both thin regions (and their concomitant low DAS values) and thick regions (with correspondingly high DAS values) are present. In a more particular option, the sampled (or seed) values are taken from a portion of the component that is possessive of the smallest DAS and highest material properties, as well as from a place demonstrating the lowest of material properties and largest DAS. In this way, the constants of the DAS-based material property models can be calibrated (or otherwise interpolated) using the values of these two extreme locations. In another option, properties at key locations in the part can be assumed, based on, for instance, a specification of minimum properties at locations where they are conveniently measured. Such a feature permits modelers to determine fatigue durability of the component at the lowest permissible properties that may exist therein. The property mapping procedure described in previous paragraphs is used accordingly to calculate nodal properties throughout the part that are consistent with the assumed properties at such key locations. It will be appreciated by those skilled in the art that although the features of the present invention are described herein as being applicable to an engine block, they are useful for determining material property distributions for other cast components as well.

According to another aspect of the present invention, an article of manufacture is disclosed. The article includes a computer usable medium with computer readable program code embodied therein for predicting a distribution of material properties of a cast alloy such that it can be used in a general-purpose computer such as discussed above. Specifically, such computer readable program code includes portions for causing the computer to: accept nodal coordinates of a geometric representation of the cast object; accept casting alloy data for the cast object; accept one or both of DAS and porosity values that have been determined from a casting solidification simulation, program or related calculation; map the casting simulation results (one or both DAS and porosity values) to the nodal coordinates; accept material property models (i.e., equations) for a material that corresponds to the cast alloy and determine material properties for the cast alloy at each of the nodal coordinates. By the present construction of the article, these various portions can cooperate to form a mapping of the cast object that can in turn be used to generate distributed (i.e., nodal) material properties that can be subsequently used in a fatigue analysis or other structural or mechanical prediction approach.

Optionally, the computer readable program code portion of the article of manufacture is additionally capable of causing the computer to deliver the determined material properties to a fatigue prediction (i.e., fatigue analysis) program. In this way, the subsequent operation of the fatigue prediction program is used to determine fatigue properties of the cast alloy and object based on the distributed material properties that have been calculated by the computer readable program code of the present invention. As will be appreciated by those skilled in the art, a computer system (such as that discussed above in conjunction with the previous aspects) can be made to cooperate with the article for the purpose of determining or otherwise predicting material properties of a casting, conducting fatigue analyses on such casting, or other calculations. In general, a fatigue durability model (i.e., equation) used in conjunction with the mapped material properties discussed herein predicts the local fatigue life or safety factors in the component.

Another option is to treat as input to the property mapping method distributed material properties predicted by an independent computer program method. An example of such a program method, herein incorporated by reference in its entirety, is entitled METHODS AND SYSTEMS FOR PREDICTING VERY HIGH CYCLE FATIGUE PROPERTIES IN METAL ALLOYS that was filed on Jul. 30, 2008, given USPTO patent application filing Ser. No. 12/182,314 and owned by the Assignee of the present invention. This may be useful if the material property prediction method predicts the relationship between properties at various locations within the part, but the absolute value of the predicted properties is in doubt. The property mapping method described in other paragraphs can accordingly be used to recalibrate independently simulated or otherwise determined properties based on measured, specified, assumed, or otherwise arbitrary properties determined at key locations throughout the part.

BRIEF DESCRIPTION OF THE DRAWINGS

The following detailed description of specific embodiments can be best understood when read in conjunction with the following drawings, where like structure is indicated with like reference numerals. The file of this patent contains at least one drawing executed in color. Copies of this patent with color drawing(s) will be provided by the Patent and Trademark Office upon request and payment of the necessary fee. Regarding the drawings:

FIG. 4B shows a notional material property database for a particular component in which ultimate tensile strength (UTS) and fatigue strength are identified at the two locations corresponding to the DAS inputs of FIG. 4A;

FIG. 7 shows a DAS distribution in an engine block predicted by a process simulation code, transferred through MATGEN and displayed through the output of a structural analysis code;

FIG. 9A shows a close up view of the calculated and mapped distribution of DAS near a bulkhead area of the engine block of FIG. 7;

FIG. 9E shows the calculated and mapped distribution of safety factors for the close up view of the engine block of FIG. 7.

Figure 2:
FIG. 2 is photomicrograph of cast aluminum alloy with a DAS of 90 micrometers.

The embodiments set forth in the drawings are illustrative in nature and are not intended to be limiting of the embodiments defined by the claims. Moreover, individual aspects of the drawings and the embodiments will be more fully apparent and understood in view of the detailed description that follows.

DETAILED DESCRIPTION OF THE PREFERRED EMBODIMENTS

The present inventors have developed the material property generation program MATGEN that reads in (or otherwise accepts, such as in text format) nodal level values from a casting process simulation software (such as the one or more of the ones mentioned above) that may include routines to consider features such as casting defects and microstructure. In one form, the values can be indicative of DAS and porosity, while in another, the values can be precursor quantities such as solidification rate and solidification time that are algorithmically related to DAS and porosity. MATGEN couples those values to a three-dimensional FEA mesh or related geometric model (such as those used in computer-aided design (CAD) or structural analysis, for example, ABAQUS, Hypermesh or the like) applications to contain node numbers as well as three-dimensional {x, y, z} coordinates that correspond to those node numbers of the component being studied (for example, an automotive engine block or cylinder head) in order to map out a nodewise distribution of material properties of the component. The MATGEN program additionally may map the DAS and porosity information to every node in the FEA mesh. Likewise, and in addition to DAS and porosity values, a nodewise field of independently predicted properties, either simulated or empirical, may also be used as input. Independently simulated or otherwise determined material mechanical properties may include, but not be limited to, tensile properties, hardness, fatigue strength, and fracture toughness. Thus, simulations with output in the form of the mechanical properties themselves can, in turn, be used as input into the program of the present invention. In this latter case, the MATGEN program of the present invention acts to calibrate simulations of mechanical properties, the latter which may accurately capture relative differences between one section and another but usually fail to predict the absolute values of properties. Going further, anything that correlates with mechanical properties in a component or related part and that can be expressed nodewise can be used as input to the program of the present invention, subject only to a constant correction factor.

Because the meshed geometry model used in the process simulation software is typically different from that used in finite element structural analysis, errors can result, even in situations where a linking program is used to facilitate the integration of FE-based meshes and meshes used in casting process simulation. The MATGEN program of the present invention can be used to bridge these links in order to provide a more accurate basis for studying cast aluminum component fatigue failure modes. Accordingly, the present invention is particularly useful (when combined with appropriate fatigue analysis algorithms) for predicting fatigue life of cast aluminum alloys, as well as any part, product or related component that is at least partially configured of such an alloy.

As discussed above, porosity and DAS can impact the fatigue lives of cast aluminum components. Regarding porosity first, the fatigue properties of cast aluminum components for a given stress state are mainly due to the presence of discontinuities and in particular, to their sizes in the materials. The fatigue strength and life can be estimated by taking into consideration porosity-based properties that can be estimated by:

$$\sigma_a = \sigma_L + \exp\left(\frac{\ln(a_{ECD}N_f) - C_0}{C_1}\right) \quad (1)$$

where $C_0$ and $C_1$ are empirical constants which are material dependent, $a_{ECD}$ is the defect (pore) equivalent circle diameter (typically measured in meters), $\sigma_a$ is the applied stress (measured in MPa), and $\sigma_L$ is the infinite life fatigue limit (also measured in MPa) of the specimen. The infinite fatigue strength $\sigma_L$ in Eqn. (1) is determined using:

$$\sigma_L = \frac{\Delta K_{eff,th}}{2Y(a_{ECD})U_R(a_{ECD})\sqrt{\pi a_{ECD}}} \quad (2)$$

where $Y(a_{ECD})$ is a geometry correction factor, $U_R(a_{ECD})$ is a crack closure correction and $K_{eff,th}$ is the effective threshold stress intensity factor of the material. The infinite life fatigue strength $\sigma_L$ is also assumed to follow a Weibull distribution given by:

$$PF = 1 - \exp\left(\frac{-\sigma_L}{\sigma_0}\right)^\beta \quad (3)$$

where PF is the probability of failure (at an infinite number of cycles), and $\sigma_o$ and $\beta$ are the Weibull parameters for the infinite life fatigue limit distribution. In cast aluminum alloys, the defect (pore) size follows well the generalized extreme value distribution:

$$F(a_{ECD}) = \exp\left\{-\left[1 + \xi\left(\frac{a_{ECD} - \mu}{\mu_0}\right)\right]^{-1/\xi}\right\} \quad (4)$$

where $\mu$ is the location parameter, $\mu_0$ is a scale parameter and $\xi$ is a shape parameter. This approach to predicting fatigue properties is the subject of the related application entitled METHODS AND SYSTEMS FOR PREDICTING VERY HIGH CYCLE FATIGUE PROPERTIES IN METAL ALLOYS discussed above.

Fatigue properties are often shown in S-N charts; such charts may also be used to compare the efficacy of various predictions from various models, an example of which is based on median pore sizes measured from test samples for porosity-based fatigue strength. If the maximum pore size is used in the fatigue model, a lower bound of the S-N curve can be predicted, in which case a majority of test data points should be above the predicted curve. Likewise, if the minimum pore size is used in the fatigue model, an upper bound of S-N curve can be predicted such that a majority of test data points should be below the predicted curve. One of the benefits of the present invention is that it allows a modeler to assume arbitrary properties at disparate control locations (for example, a bulkhead and a bolt boss in an engine block) as a basis for mapping self-consistent properties throughout the part or component being simulated. The data shown in these figures substantiate that properties from porosity-based models (which may be referred to as independently modeled properties) agree with test data generated by the inventors.

Such charts or related graphical illustrations thus serve as a convenient way to compare predictions (for example, porosity-based fatigue strength/life models) with testing data; moreover, these can be conducted at room temperature and elevated temperature conditions, as well as from different locations for components cast by different processes. The resulting information shows generally the relationship between porosity and fatigue, and more particularly when there is good agreement between theory and data.

Figure 1:
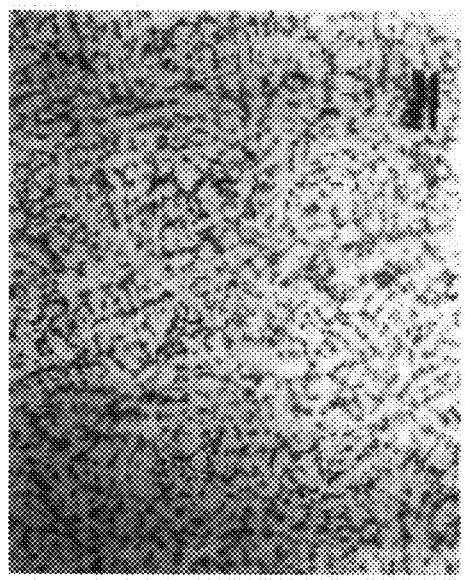
FIG. 1 is photomicrograph of cast aluminum alloy with a DAS of 30 micrometers.

Regarding DAS, predictions for such values can also be determined through the use of appropriate models. Referring next to FIG. 7 in conjunction with FIGS. 1 and 2, a contour plot showing the spread of DAS values across a simulated engine block 300 is shown. It is known that the material properties of cast aluminum alloys depend strongly on DAS. As stated above, smaller DAS values are in evidence at the block's bulkhead location 310 (shown as the dark blue color areas) and larger DAS values at the block's bolt boss 320 (shown as the red and yellow color areas). The present inventors use DAS values and material property values that have been measured in these two areas 310, 320 as a way to determine upper and lower bound DAS values in order to facilitate a fit for any DAS-based material property model in intermediate regions of the engine block 300 that are between these two extremes. As discussed above, such intermediate region determinations may be made by interpolating the seed DAS values at the outer bounds based on known material properties within the casting. Such known material properties can be taken from a material property database (for example, in the form of a lookup table) that contains the measured or specified material properties for different alloys. This allows any location within the simulated engine block 300 (or any other component) to be calculated with a greater degree of accuracy than with a simulation that assumes constant or relatively constant material properties throughout. Such is beneficial in that it adds to the designed life of a component made from aluminum alloys by allowing for a more accurate prediction of fatigue properties. This in turn can lead to improved product quality and reduced warranty and related costs. Tools such as those of the present invention can further reduce development and production costs of such aluminum alloys, in addition to simplifying fatigue measurement and testing of such components.

Figure 6:
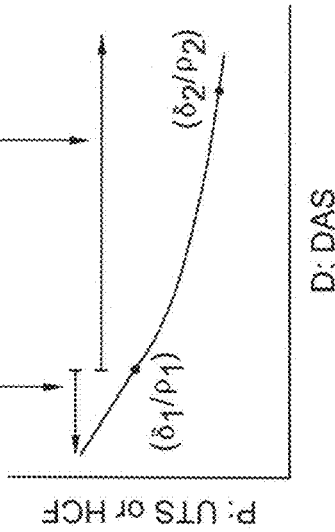
FIG. 6 shows property mapping equations for UTS or fatigue strength versus nodewise DAS.
Figure 8A:
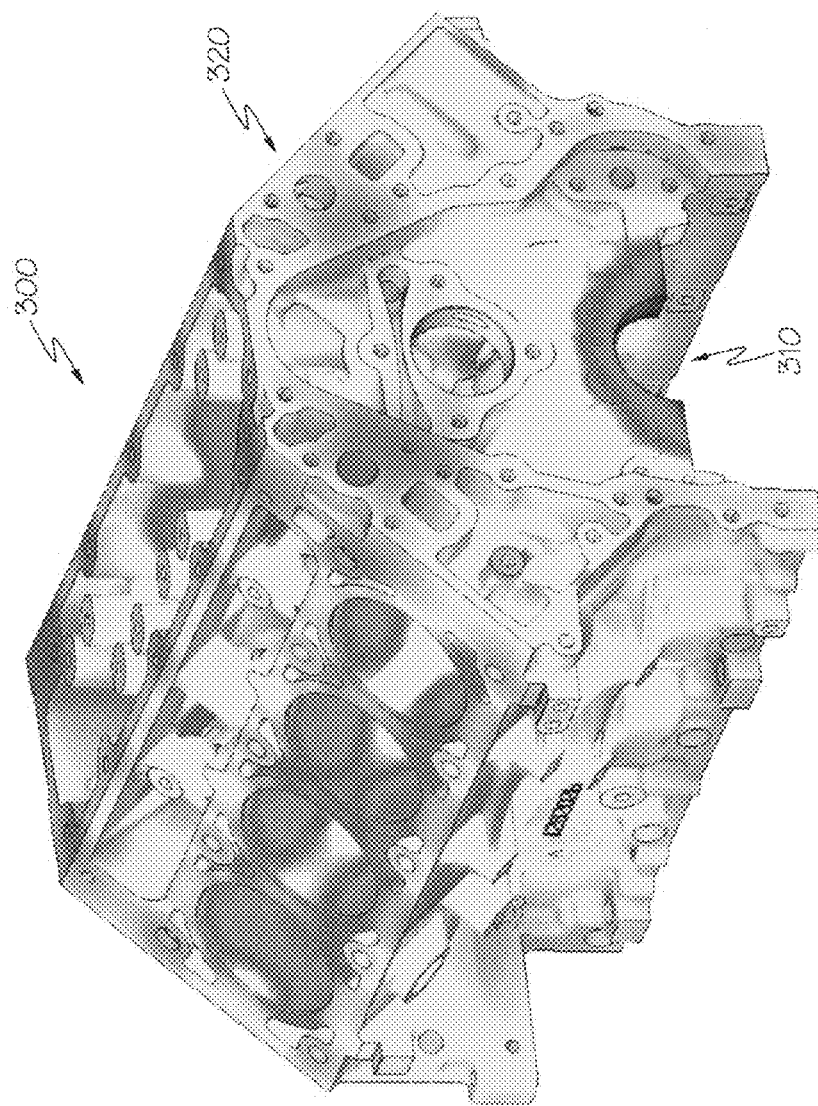
FIG. 8A shows the calculated and mapped distribution of UTS from MATGEN for the engine block of FIG. 7.
Figure 8B:
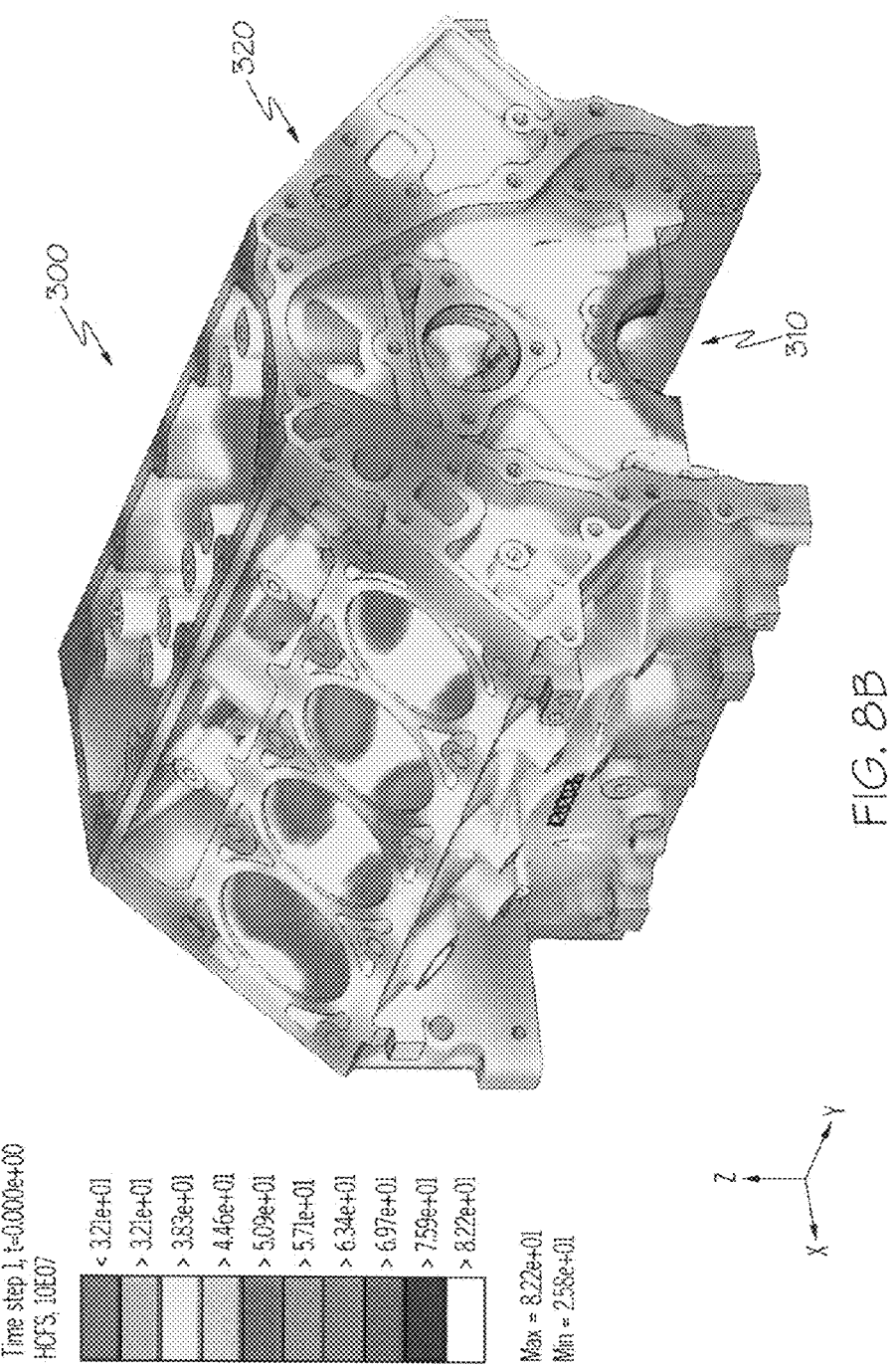
FIG. 8B shows the calculated and mapped distribution of high cycle fatigue (HCF) strength through MATGEN for the engine block of FIG. 7.
Figure 9B:
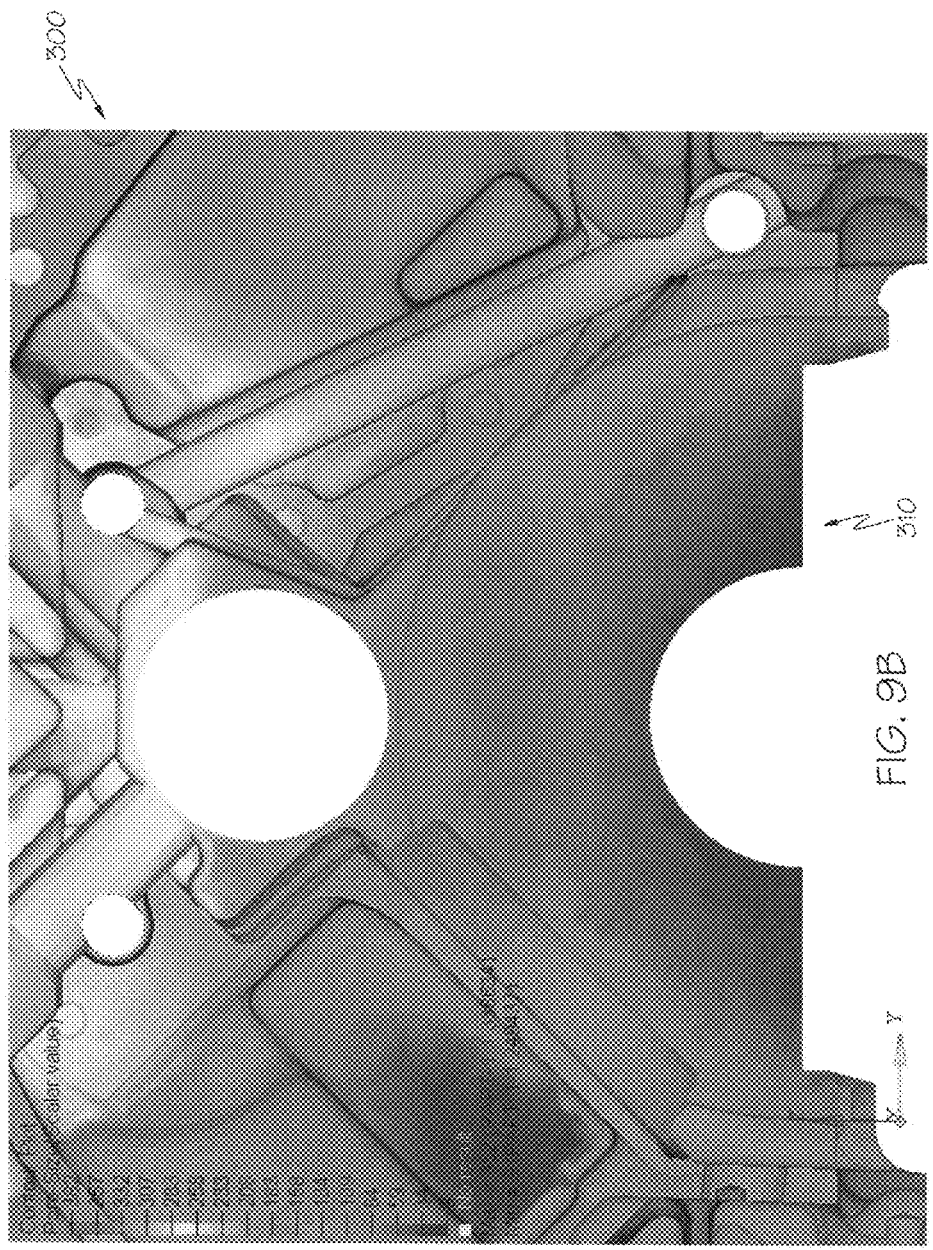
FIG. 9B shows the calculated and mapped distribution of pore sizes for the close up view of the engine block of FIG. 7.
Figure 9C:
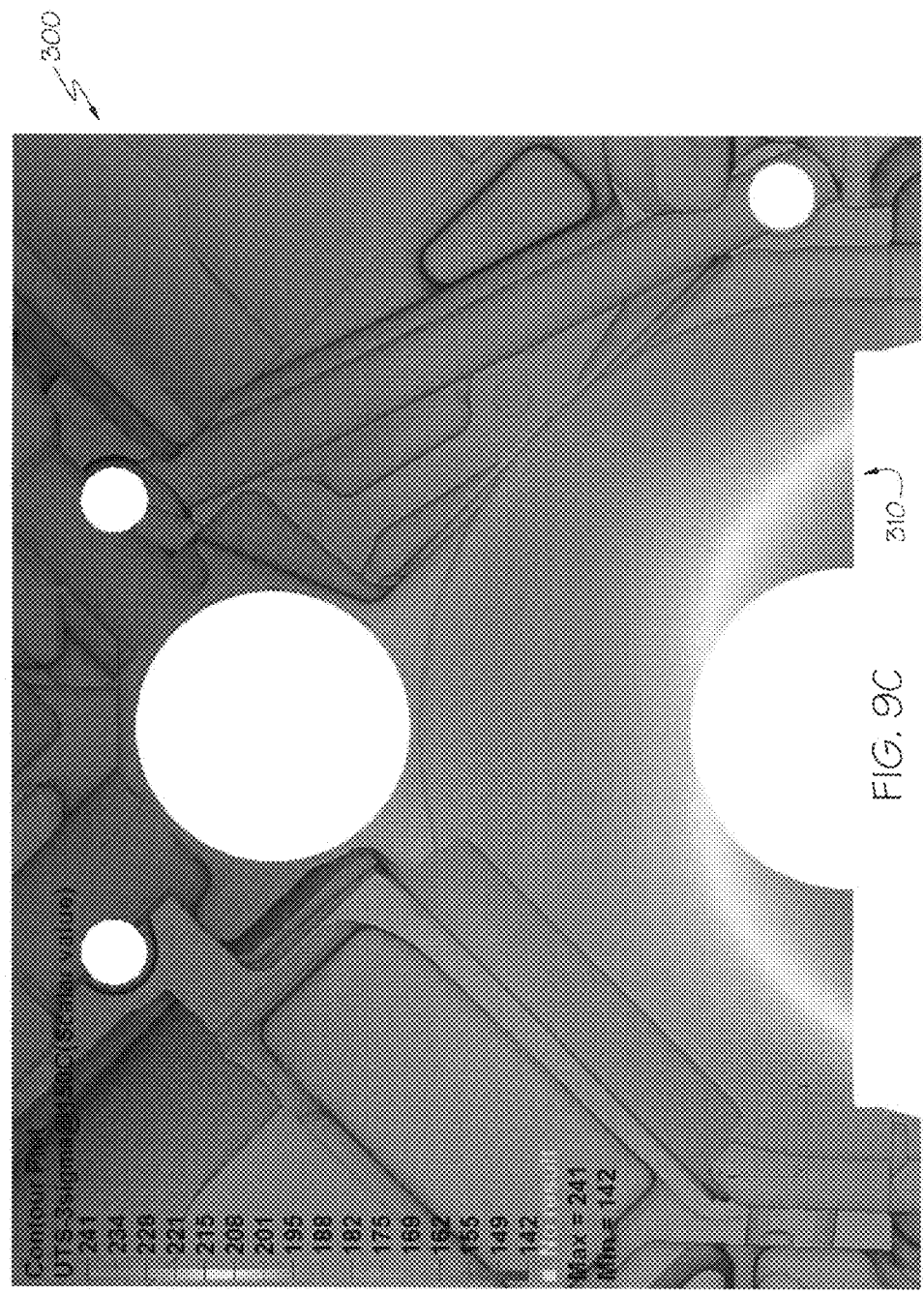
FIG. 9C shows the calculated and mapped distribution of UTS for the close up view of the engine block of FIG. 7.
Figure 9D:
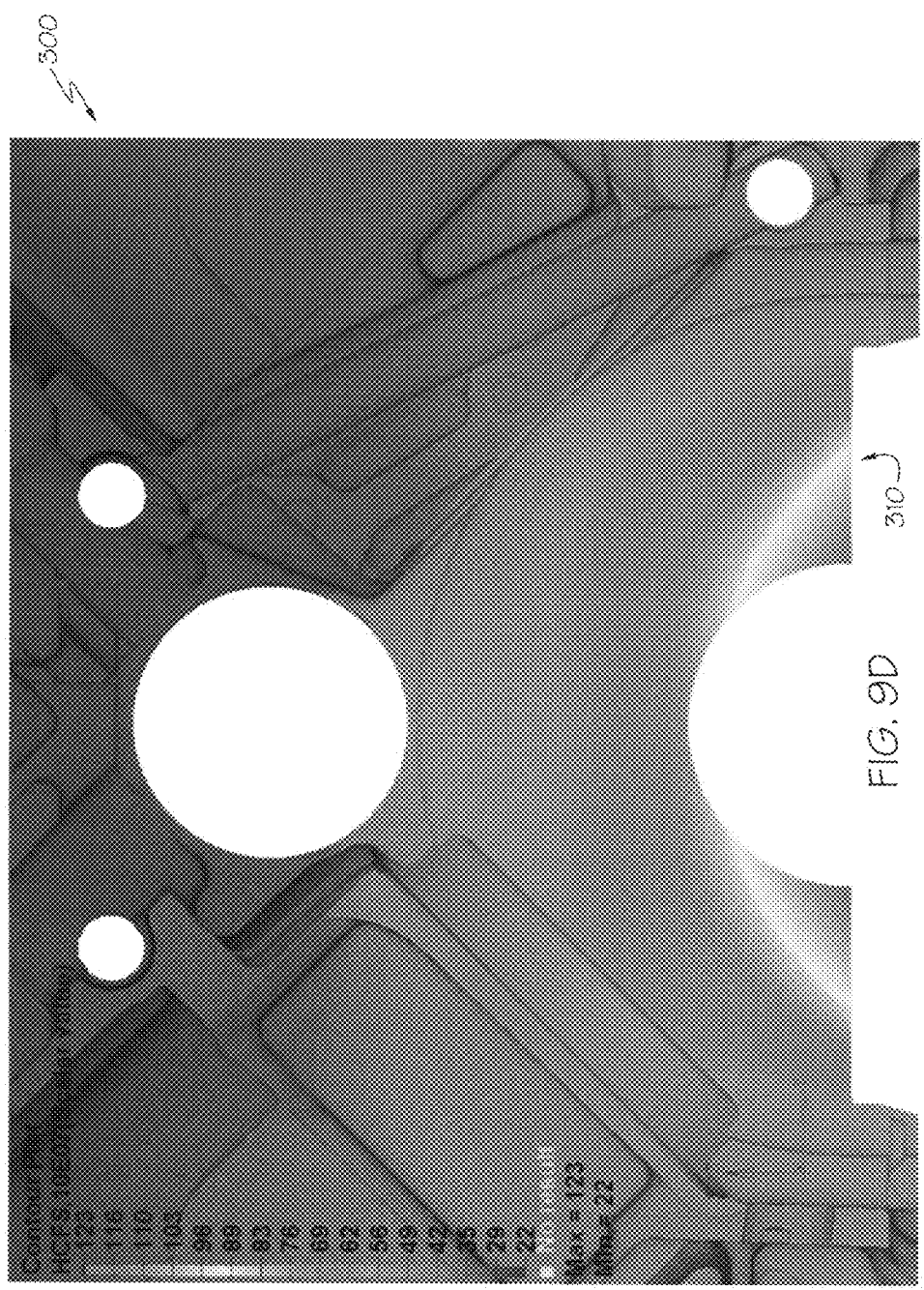
FIG. 9D shows the calculated and mapped distribution of HCF strength for the close up view of the engine block of FIG. 7.

Referring next to FIG. 6, property mapping equations can be used to estimate tensile strength and fatigue strength based on DAS as shown. In a purely empirical alternative to independently modeling a cast component to determine mechanical properties, a database that tabulates material properties of interest at designated locations in parts can be used. From there, a field of solidification or other parameters that are outputted from or otherwise determined by a solidification model can be combined with tabulated properties in the material property database as a basis for interpolation or extrapolation of estimated properties between or beyond the designated locations containing the tabulated properties. Such tabulated properties may themselves be estimates based on experimental data, specifications or modeler experience. In one example, a solidification parameter could be the solidification time (the time to cool component from liquidus to solidus) that can be used to predict DAS. In such case, solidification time (converted to DAS) could be mapped throughout a particular component (such as an engine head, block or other such component where a database of tabulated mechanical properties can be retrieved), and have the tabulated fatigue strength matched with the DAS in designated locations (such as those shown in the figures) in order to create a map of fatigue strength throughout the part. In an alternative form, other common thermal parameter outputs such as cooling rate (R) and temperature gradient (G) could also be used. As stated above, a nodewise field of independently simulated or otherwise determined properties (such as tensile, hardness, fatigue strength or fracture toughness) in a part being simulated can be used as input. Such simulated properties may differ from actual properties only by a constant calibration amount that the present invention serves to correct. From such an empirical approach, the present inventors have used DAS as the basis for mapping the properties of a simulated cast component. The mapped material property "P" at a node having a DAS value of "D" can be expressed by the two equations as follows:

$$P = \frac{\rho_2}{\delta_2^b} D^b \qquad (5a)$$

$$P = \frac{\rho_2}{\delta_2^b} \delta_1^{b-1}(D - \delta_1) + \rho_1 \qquad (5b)$$

where the first (Eqn. 5a) is for situations where D is greater than or equal to $\delta_1$ and the second (Eqn. 5b) for situations where D is less than $\delta_1$. As can be seen in the figure, Eqn. 5a corresponds to a straight line portion at the left end of the graph, while Eqn. 5b corresponds to the curved line portion at the right end of the graph. The exponential quantity "b" is represented by the following:

$$b = \frac{\log(\rho_2/\rho_1)}{\log(\delta_2/\delta_1)} \qquad (6)$$

For automotive engine applications, the location ($\delta_1$, $\rho_1$) may be made to correspond to the property at the engine block bulkheads, while the location ($\delta_2$, $\rho_2$) may be made to correspond to the property at the engine block bolt bosses. The present approach allows the fitting of two predetermined points with a power-law equation. For extrapolation beyond the smaller DAS/higher property data point, the function becomes a straight line having the same slope as the power-law equation at that point, as mentioned above. This combination of equations fits the following observed UTS and HCF strength properties, particularly as they relate to flattening of the linear curve at large DAS values, as well as avoiding unrealistic overprediction of properties at small DAS values. It will be appreciated by those skilled in the art that the microstructure of eutectic and hypereutectic alloys (which are non-dendritic such that DAS may not apply) can be modeled with other factors, such as the cube root of solidification time that, as used in certain solidification software for hypoeutectic alloys (for example, MAGMASoft), is proportional to DAS. As such, knowledge of solidification time is a precursor to knowledge of DAS. In some instances, it may be preferable to employ solidification time to solidification rate, as the former may be less arbitrary than the latter, where data associated with the component in question can be acquired at two different times as a measure of the rate. In situations where the rates aren't constant, temperature excursions may occur (for example, going up when they should be cooling down).

Figure 3:
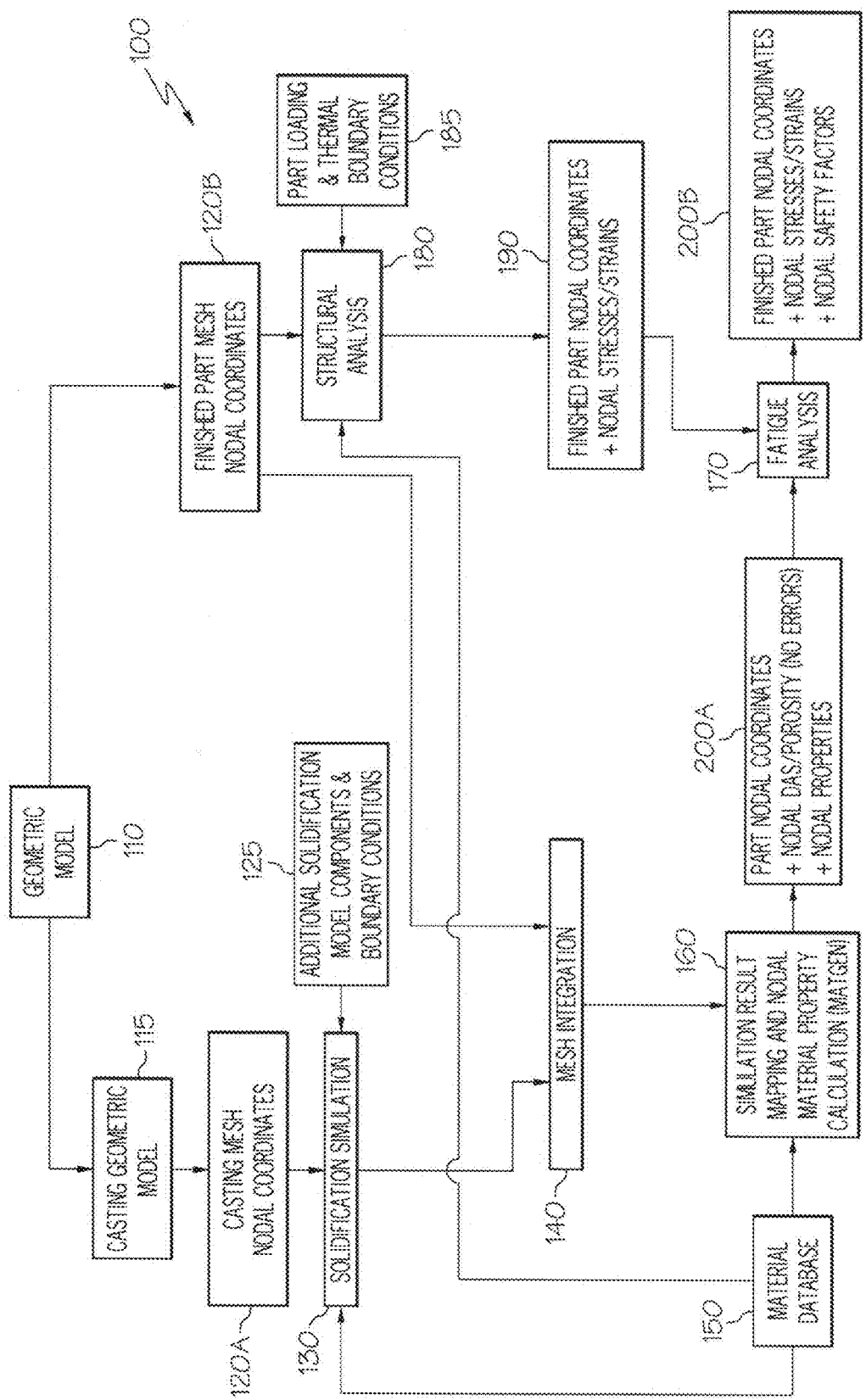
FIG. 3 is a block diagram of a system to determine material properties within an aluminum alloy cast component according to one embodiment of the present invention.

Referring next to FIG. 3, a block diagram depicting a sequence 100 of events that may be employed to determine a distribution of material properties within a casting is shown. Such a sequence may be run on a computer system or related data processing device. A part begins as a three-dimensional geometric model 110 (or part geometric model) created in commercially available code (such as Unigraphics NX, Autocad 3D or the like). Likewise, a casting geometric model 115 is commonly created; such a model includes provisions for additional material that will eventually be machined off in the finished part that is represented by geometric model 110. In a typical form, the casting geometric model 115 is an offshoot or byproduct of the part geometric model 110. As can be seen in the figure, the process divides into two paths, a first of which ensures that the casting geometric model 115 is transformed by commercially available code into a mesh of points or nodes characterized by casting mesh nodal coordinates 120A that are typically an FEA or FD mesh representing cubes. A solidification code 130 accepts the casting FEA or FD mesh 120A along with the mesh of additional casting components (for example, a casting mold) and boundary conditions 125, plus thermophysical property data from a material property database 150. As discussed earlier, the material property database 150 provides data three times in the present method, including thermophysical data for the solidification simulation 130, stress-strain data for the structural analysis 180 and failure criteria data defined at two separate component locations for fatigue analysis such as shown at FIG. 4B. As will be appreciated by those skilled in the art, the behavior of each node in an FEA mesh is determined by the behavior of adjacent nodes. Boundary conditions are those nodes in the FEA mesh that are acted upon by stimuli external to the simulated component. For example, in casting solidification, this could include resistance to transfer of heat from the casting to the mold. A boundary condition could be an initial state of a node, examples of which include temperatures of the metal and various points in the mold at the start of solidification, bolt stresses, inertial loading of other components, combustion events or the like. The solidification simulation 130 is commonly preceded by a simulation of filling the casting mold cavity to establish thermal conditions at the initiation of casting. Both fill simulation and solidification simulation 130 can be performed by commercially available code (such as MAGMA, ProCAST, EKK, WRAFTS, Anycasting or the like). Solidification simulation 130 is commonly used to evaluate choices made in design of the part from the three-dimensional geometric model 110, the related casting components and boundary conditions 125, and the material property database 150. Thermal parameters generated during solidification simulation 130 permit estimation of measures of casting characteristics, such as DAS, porosity and other microstructural features. Such results are tabulated against the numbered nodes in the casting simulation 120A in, for instance, a computer-readable text file. The solidification is simulated for two reasons. First, it is used for evaluation of the casting design, which in addition to extra machining stock, would include gates, runners and risers, and effect of the mold design as well. Second, it is used for evaluation of the part design, as frequently the part geometry is changed because optional features in the casting don't always, by themselves, eliminate all detrimental defects that may arise when a component designer approaches the limit of the particular casting.

In the second of the two paths discussed above, a mesh of points or nodes for the finished cast part is created, characterized by nodal coordinates 120B with commonly non-cubic spatial geometry for FEA simulation. These finished part FEA mesh nodal coordinates 120B may be quite different than the casting FEA or FD mesh nodal coordinates 120A. For example, the finished part FEA mesh 120B includes nodal coordinate information of the component once all casting and post-casting operations have been performed. As discussed below, reconciling these two different mesh nodal coordinates 120A, 120B will introduce errors that will need to be corrected. A structural modeling code in the form of structural FEA or structural analysis 180 accepts as input the finished part mesh nodal coordinates 120B along with part loading and thermal boundary conditions 185, plus data from the material property database 150. The result from structural analysis 180 is a representation of stresses and strains 190 that are tabulated against the nodal coordinates in the finished part mesh 120B. The structural analysis 180 is commonly repeated under multiple loading and thermal conditions of the cast part, representing, for instance, different segments of the duty cycle of an engine. The maximum and minimum stresses and strain from repeated simulations under different operating conditions serve to establish fatigue loading conditions, which are implicitly included in stresses and strains 190. The structural analysis 180 accepts the finished part mesh 120B along with loading and thermal boundary conditions 185, plus mechanical property data from the material property database 150. The result is a representation of stresses and strains 190 that are tabulated against the nodal coordinates in the finished part mesh 120B.

A mesh integration code 140 (such as MAGMALink or related commercially available software) accepts the finished part mesh nodal coordinates 120B and the casting mesh nodal coordinates 120A (the latter of which has been operated upon by the solidification simulation 130 to produce the corresponding DAS and porosity results), and calculates values of DAS and porosity that correspond to the nodal coordinates of the finished part. As mentioned above, this calculation commonly contains errors because the nodal coordinates of the casting mesh 120A may disagree somewhat with the nodal coordinates of the finished part mesh 120B; such disparity may be due (for instance) to geometric simplification from a representation of the casting as a collection of cubes. This difference, even if slight, can still generate outlying numbers in some nodes. As such, it is advantageous to correct the values on these nodes by using the mapping algorithm that forms at least one portion of the present invention.

The simulation result mapping program (i.e., MATGEN) 160 accepts the results from mesh integration code 140 that contains nodal DAS (and related) values and corrects the integration errors that may arise out of differences in casting FEA or FD mesh nodal coordinates 120A and finished part FEA mesh nodal coordinates 120B. MATGEN 160 also accepts data from the material property database 150 and calculates nodal properties the output of which is tabulated against the numbered nodes in the finished part mesh nodal coordinates 120B. Both the corrected nodal coordinates and the nodal properties are shown as 200A and can be seen as the culmination of calculating at least an approximation of material properties to correct for nodewise differences in received material property information, as well as the mapping of these approximated material properties to respective nodal coordinates of the finished part mesh simulation. These nodal properties can be subsequently input to fatigue analysis 170 or a related post-processing step used to determine the propensity that the node in question will fail. The fatigue analysis 170 takes all of this data, as well as the nodal stresses and strains 190 from the structural analysis 180, and calculates nodal safety factors, as shown at 200B. As such, the finished part nodal coordinates of 200B will incorporate all of the corrected nodal DAS and porosity information and nodal properties of 200A.

The fatigue analysis code 170, CAD code or related FE-based program can be used in order to allow the simulated stresses and strains 190 at each node of the finished part to be interpreted by a component designer or other user. A common method of interpretation is to calculate the fatigue safety factors that are generated at 200B. By way of example, the simulation result mapping capabilities of MATGEN 160 can generate a Hypermesh visualization file by mapping the calculated mechanical properties to an FEA mesh in a text format. The Hypermesh code can then read in the file and show the mechanical properties for each node by some readily-apparent visual indicia, such as by color contour or some related approach. As described above, MATGEN 160 has the capability to map the nodal result from one FEA or FD mesh to another, even though in some circumstances the mesh integration program 140 may have already done some of the work. In some instances (not shown), the results from MATGEN 160 can be merged with those of the calculated stresses and strains 190 prior to conducting fatigue analysis 170, while in others (as shown in the figure), they can be introduced into the fatigue analysis 170 separately. In other words, the mesh integration 140 and mapping under MATGEN 160 may have their orders reversed, depending on whether the MATGEN 160 is merged with the nodal stresses and strains 190. In the situation where MATGEN 160 is performed first, the nodal DAS and related numbers in the solidification mesh are transformed into nodal properties, after which they are mapped or otherwise integrated into the finished part mesh.

Figure 5:
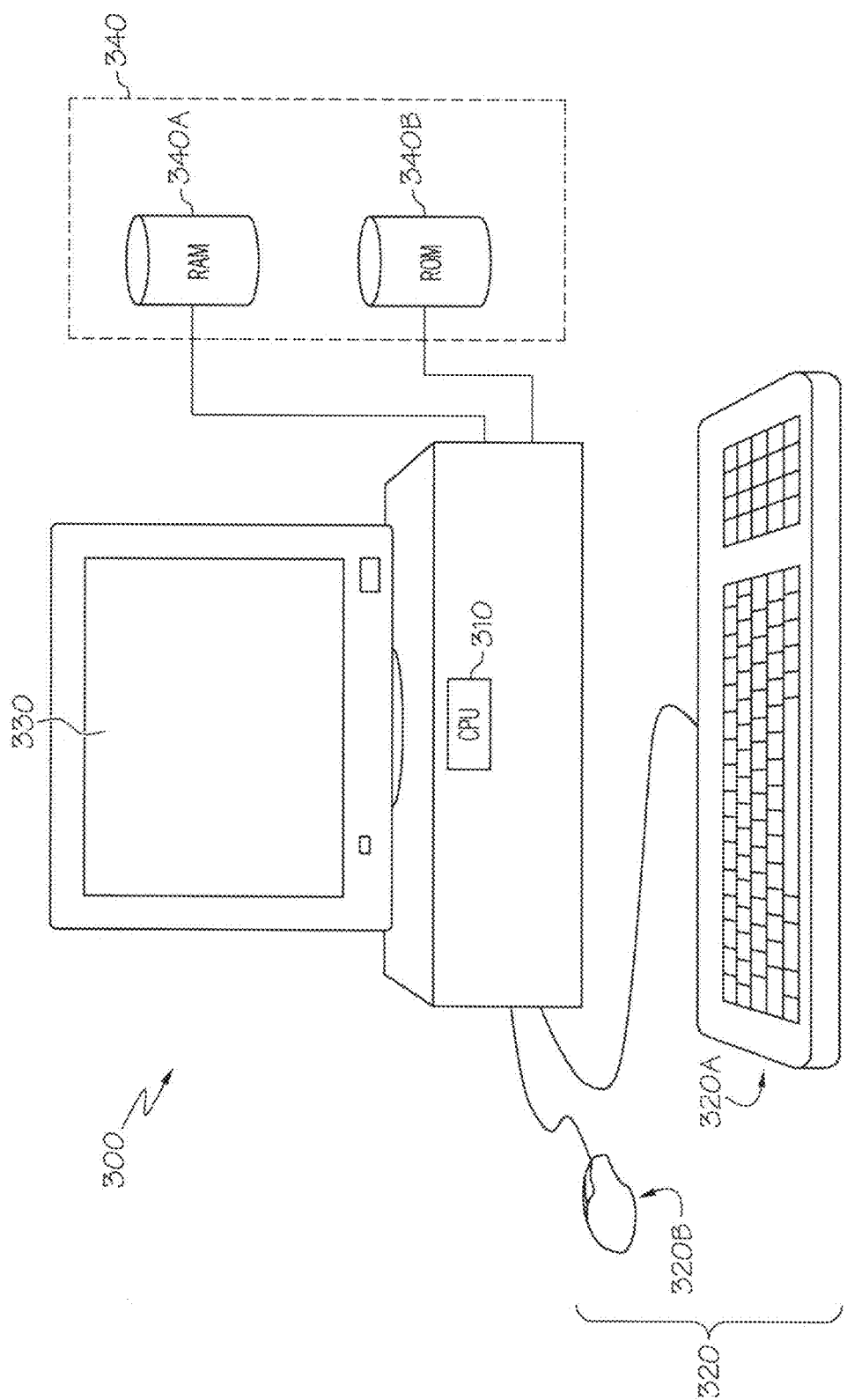
FIG. 5 shows a system and computer-usable medium that together can be used to determine material properties within an aluminum alloy cast component according to one embodiment of the present invention.

Referring next to FIG. 5, a system 300 (which may be referred to as a computer system data processing system or the like) that can be used to perform the methods of the present invention is shown. In addition to determining a distribution of material and related mechanical or structural properties in a component made from a cast aluminum alloy, the system 300 can predict a fatigue life of the component. The system 300 includes a processing unit 310 (which may be in the form of one or more microprocessors), one or more mechanisms for information input 320 (including a keyboard 320A, mouse 320B or other device, such as a voice-recognition receiver (not shown)) a display screen or related information output 330, a computer-readable medium 340 that may include information memory in the form of random-access memory (RAM) 340A (also called mass memory, which can be used for the temporary storage of data) and instruction-storing memory in the form of read-only memory (ROM) 340B and computer-readable program code means (not shown) to process at least a portion of the received information relating to the aluminum alloy. In a particular form, the computer-readable program code means is a micromechanics-based fatigue life model that is loaded into ROM 340B. The processing unit 310 is capable of interpreting instructions from the computer-readable program code means, as well as processing data and controlling other devices within system 300. As will be understood by those skilled in the computer art, system 300 may additionally include additional chipsets, as well as a bus and related wiring for conveying data and related information between processing unit 310 and other devices (such as the aforementioned input, output and memory devices) within system 300. Upon having the program code means loaded into ROM 340B, the system 300 becomes a specific-purpose machine configured to predict the various material property distributions for a component in a manner according to the present invention.

System 300 is configured through input 320 to receive at least one of information relating to the aluminum alloy and information relating to a stress state present in the aluminum alloy, this information cumulatively referred to herein as "received information". Such information may relate to detailed microstructure characteristics of the aluminum alloy including probabilistics of such characteristics in the event that they are dependent upon parameters associated with statistical variations of alloy compositions, casting, solidification or the like. In either event, this information can be provided by various means of measurements including conventional metallographic measurements that can be are used with extreme value statistics (EVS) and cumulative distribution functions to characterize casting defects and microstructure characteristics. It will be appreciated by those skilled in the art that there are other ways to receive data and related information besides the manual input approach depicted in input 320 (especially in situations where large amounts of data are being input), and that any conventional means for providing such data in order to allow processing unit 310 to operate on it is within the scope of the present invention. The information output 330 is configured to convey information relating to the aluminum alloy to a user (when, for example, the information output 330 is in the form of a screen as shown) or to another program or simulation. The computer-readable medium 340 is cooperative with the processing unit 310 and the micromechanics-based fatigue life model to predict the fatigue life of the aluminum alloy by processing the received information. The information relating to the aluminum alloy conveyed by the information output 330 includes the fatigue life of the aluminum alloy predicted by the fatigue life model.

Figure 4A:
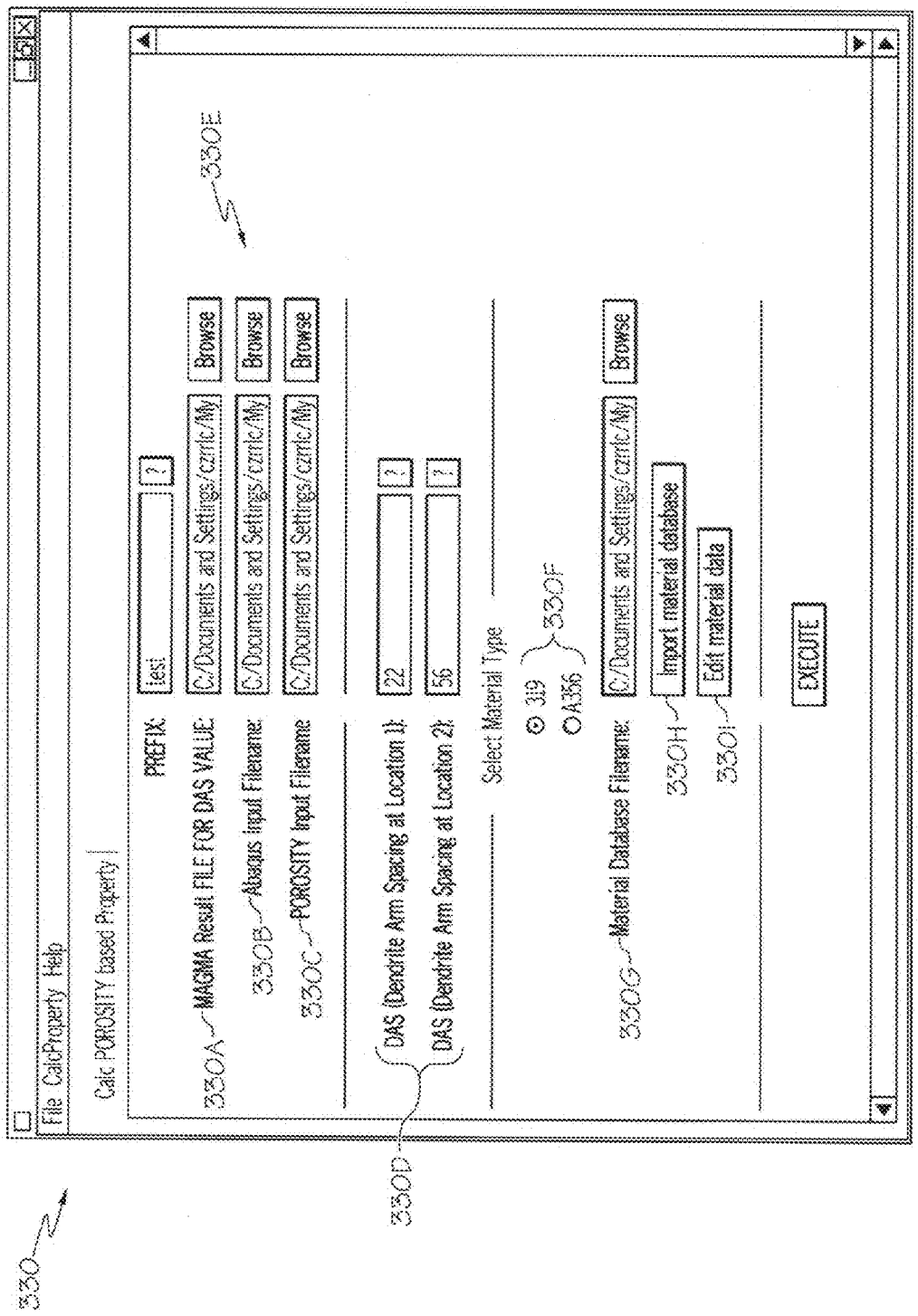
FIG. 4A shows a notional computer screen where a user may input various files that correspond to casting simulations, FEA geometries, DAS at two locations within the component being simulated, material property databases and other information for the purpose of determining material properties in a manner in conjunction with the present invention.

Referring next to FIGS. 4A and 4B in conjunction with FIG. 3, output 330 (in the form of a computer or related data-entry screen) shows the results of one form of information being input. In addition to conventional mouse 320B or keyboard 320A input (as shown in FIG. 5), a preferred embodiment may have the information be input in the form of a graphical user interface (GUI) that may allow, in addition to manual data input by typing characters, clicking menus or the like, touch-screen entry of data directly on output 330. Referring with particularity to FIG. 4A, the received information that may be loaded into the simulation or program may include casting simulation results 330A (which contains the DAS and porosity values and the node information from solidification simulation 130), a structural FEA file (with nodal and three-dimensional coordinates and element connectivity information as shown in FIG. 3 as part nodal coordinates and nodal stresses and strains 190 that comes from the structural analysis 180) 330B, porosity input files 330C and DAS properties at various locations within the casting 330D, as well as an ability to browse through a list of files related to each of at least the casting simulation, geometry and porosity. In one form, the DAS properties at various locations within the casting 330D may be manually input identifying the appropriate DAS (or porosity, or solidification time or the like) values at the two component locations of interest that have the defined material properties (such as the failure criteria material properties). This may be done in conjunction with other steps, such as having a user inspect the result of solidification simulation 130 and determine what the DAS is at the two locations of interest. Likewise, aluminum alloy Material types 330F and material property databases 330G (which is the output from material property database 150) may also be entered, as well as providing the ability to import 330H or edit 330I a material property database. Of these last two, import material property database 330H functions as a "GO" button, causing MATGEN 160 to read the failure criteria data of the material property database 330G, while the edit material data 330I capability offers functionality to manually modify the material property values. All of the fields depicted in both FIGS. 4A and 4B are used as input into the fatigue analysis 170 of FIG. 3.

Referring next to FIG. 4B, calculation of the DAS-based material properties equations can be achieved by taking predetermined material properties from two locations of a cast aluminum engine block or other part with different DAS values. As indicated, UTS and fatigue strength at these two locations can be determined experimentally or by other means. Referring to FIG. 7, the highest DAS value is about 56 in the bolt boss location, while the lowest is about 22 in the bulkhead location. Taking into consideration these two DAS values and the material properties measured in the two locations as shown in FIG. 4B, the constants of the DAS-based equations can be easily calibrated.

As stated above in conjunction with FIG. 5, property values from the material property database 150 and simulated DAS 330D at the corresponding locations serve as constants in the property mapping equations of FIG. 6 which transform nodal DAS values from the casting solidification simulation 130 of FIG. 3 into properties mapped to nodal coordinates. Referring again to FIG. 4A, once a particular component and its attendant properties have been selected for entry into system 300, they can be used for structural durability and fatigue analysis by selecting an appropriate set of material properties for every node that is produced in the FEA mesh with stresses and strains, identified as 190 in FIG. 3. As will be appreciated by those skilled in the art, various material properties that can be read into the simulation code from the material property database 150 may include modulus of elasticity, Poisson's ratio, UTS, yield strength, fatigue strength coefficients, fatigue strength exponents, slopes, fatigue ductility coefficients, fatigue ductility exponents and stress-life data points, as well as temperature dependency information.

The methods and articles of manufacture discussed herein that include computational routines, programs or simulations according to the present invention additionally may be configured to cooperate with or include computer-readable program code means to predict a fatigue life of an aluminum alloy under cyclic loading. For example, as discussed above, they may further include predicting the fatigue life of the aluminum alloy with the computer-based system according to processes of the computer-readable program code means. In one embodiment, the computer-readable program code means used to simulate the distribution of material properties cast component can be used with a fatigue model. Such a fatigue model may include code segments or modules to allow calculation of low cycle fatigue, high cycle fatigue (either in the form of single-axis or multi-axis variants) or other fatigue-related phenomena. Additional fatigue-related considerations may also be evaluated or otherwise taken into consideration, including critical shear planes and related maximum shear strain amplitude, damage factors, normal strain amplitude, shear stress amplitude, normal stress amplitude, hardening factors, fatigue strength coefficient, fatigue ductility coefficient, fatigue strength exponent, and a fatigue ductility exponent, non-proportionality value, microstructural, thermophysical, and mechanical properties, grain size, defect size, defect volume fraction, shear modulus value, Poisson ratio and Young's modulus values.

Referring again to FIG. 3, the following explains how data from MATGEN 160 can be used to conduct the fatigue analysis 170. At the outset, various types of material data are required in the current fatigue analysis 170 of structural components. Such data can be taken (for example) from material property database 150 discussed above. This data may include UTS, cyclic strength coefficient (K'), cyclic strength hardening exponent (n'), fatigue strength coefficient ($\sigma'_f$), fatigue strength exponent (b) and S-N curve data (which may include fatigue strengths at both ten thousand and ten million cycles). In practice, the available material testing data are only from the limited locations in a component due to the required material volume for testing. For example, in one material property database typically employed by the Assignee of the present invention, the testing data are usually from two typical locations, such as head bolt boss and deck for an automotive engine cylinder head and head bolt boss and bulkhead (such as in a crankshaft journal area) for an automotive engine cylinder block. These two locations usually represent high and low DAS numbers respectively. Material data for a third typical location representing the medium DAS number may also be used for certain components within the casting, and one exemplary situation could be a water jacket area formed in an automotive engine block).

In a conventional fatigue analysis, an analyst is required to subjectively identify a connection between particular component locations and the material identifications and then adopt one of various procedures used in the analysis. Such procedures include conducting fatigue analysis one time with grouped node sets in the finished part FEA mesh based on the identified material. Material behaviors in such a procedure are inaccurately assumed to be the same for the nodes in each of the various zones. In another procedure, the fatigue analysis is run multiple times by assigning the same material property data to every node in the whole FEA mesh each time; by inaccurately assuming that every node is possessive of the same material behavior, this approach suffers from the same problem as the first one. Furthermore, such an approach would necessitate multiple analysis iterations as well as a concomitant increase in post-processing and reporting of the fatigue analysis results.

By contrast, the approach of the present invention accepts inputs of material data representing two locations that have the low and high solidification rate and solidification time (or related DAS or porosity) extremes, as discussed above in conjunction with FIG. 6. Likewise, a distribution produced by a process simulation code (such as a DAS distribution associated with the solidification simulation 130) may be used, showing such values at each of the casting FEA or FD mesh nodal coordinates of the simulated component. MATGEN 160 receives these nodewise process simulation results and the material data (such as identified in FIG. 4B for two locations), and calculates nodewise material property data. In this way, MATGEN 160 essentially takes a material property database identified at two nodes (or part locations) and expands it to a database (which may typically contain between one hundred thousand and a million nodes) with the properties at each node differing from those at it neighbors as a function of differences in DAS, porosity or the like. In situations where DAS is used, such differences can be found via interpolation based on the DAS number for each node that is presented in the nodal stresses and strains that are tabulated against nodal coordinates 190 of the structural analysis 180.

With the mapped material data read into the fatigue analysis 170 and durability analysis 200B, both safety factor and fatigue life can be calculated as a way to improve fatigue analysis accuracy. FIGS. 9A through 9E show the distributions in a bulkhead area of the engine block 300 of FIG. 7 in the form of color contours of DAS (FIG. 9A), pore size (FIG. 9B), UTS (FIG. 9C), HCF strength (FIG. 9D) and safety factor (FIG. 9E) results. For example, the predicted safety factor with the new approach for the location shown in FIG. 9E agrees well with testing results, where the predicted safety factors of 0.87 and 0.95 are based on DAS and pore size, respectively. In companion testing, the present inventors found there to be no failure found in the analyzed location. This is in contrast to a traditional analysis that would have predicted a safety factor of about 0.6, which would correspond to indicating a high possibility of failure.

While the bulk of the present disclosure pertains to simulating a casting, it will be appreciated by those skilled in the art that such simulation may be extended to any manufactured part. In this way, the independently predicted or simulated properties discussed above are applicable to parts irrespective of their method of manufacture, so long as there is (empirical or simulated) knowledge of the process for the distribution of property-related structure, or the properties themselves. For example, simulations of the distribution of porosity in powder metal parts may be used as a basis to map properties. Likewise, there are simulations for powder metal parts that directly predict the properties. Such a field of predicted properties could be used as an input to the program of the present invention, which in turn would calibrate and fine-tune the predicted properties.

It is noted that recitations herein of a component of an embodiment being "configured" in a particular way or to embody a particular property, or function in a particular manner, are structural recitations as opposed to recitations of intended use. More specifically, the references herein to the manner in which a component is "configured" denotes an existing physical condition of the component and, as such, is to be taken as a definite recitation of the structural factors of the component. Likewise, for the purposes of describing and defining embodiments herein it is noted that the terms "substantially," "significantly," and "approximately" are utilized herein to represent the inherent degree of uncertainty that may be attributed to any quantitative comparison, value, measurement, or other representation, and as such may represent the degree by which a quantitative representation may vary from a stated reference without resulting in a change in the basic function of the subject matter at issue.

Having described embodiments of the present invention in detail, and by reference to specific embodiments thereof, it will be apparent that modifications and variations are possible without departing from the scope of the embodiments defined in the appended claims. More specifically, although some aspects of embodiments of the present invention are identified herein as preferred or particularly advantageous, it is contemplated that the embodiments of the present invention are not necessarily limited to these preferred aspects.

What is claimed is:

1. A method of mapping out a nodewise distribution of material properties within a cast component, said method comprising:
    configuring a computer system to comprise a data input, a data output, at least one processing unit and at least one of data-containing memory and instruction-containing memory that are cooperative with one another through a data communication path;
    receiving as input to said computer system nodal coordinates corresponding to both a finished part mesh simulation and a casting mesh simulation;
    receiving as input to said computer system material property information from a material property database;
    receiving as input to said computer system information pertaining to at least one of solidification simulation components and boundary conditions;
    determining values for at least one of solidification time and solidification rate based on said received at least one of solidification simulation components and boundary conditions and said received material property information at each node of said casting mesh simulation;
    integrating said determined values with said nodal coordinates from said finished part mesh simulation;
    calculating at least an approximation of material properties through an algorithm that corrects for nodewise differences in said received material property information, said algorithm comprising interpolating material properties between a high dendrite arm spacing number region of said cast component and a low dendrite arm spacing number region of said cast component, wherein the high dendrite arm spacing number corresponds to an upper bound dendrite arm spacing value of neighboring nodal coordinates of the region and the low dendrite arm spacing number corresponds to a lower bound dendrite arm spacing value of neighboring nodal coordinates of the region; and
    mapping said approximated material properties to respective nodal coordinates of said finished part mesh simulation.

2. The method of claim 1, wherein said determining values for at least one of solidification time and solidification rate comprises determining at least one of dendrite arm spacing and porosity based on said determined solidification time and solidification rate values.

3. The method of claim 1, wherein said received material property information is also used as input in determination of nodal stresses and strains in a structural analysis of said finished part mesh simulation.

4. The method of claim 3, further comprising combining said mapped approximated material properties corresponding to said respective nodal coordinates of said finished part mesh simulation with said determined stresses and strains as part of a fatigue analysis.

5. The method of claim 4, wherein said mapped approximated material properties corresponding to said respective nodal coordinates of said finished part mesh simulation are combined with said determined stresses and strains prior to conducting said fatigue analysis.

6. The method of claim 4, wherein said mapped approximated material properties corresponding to said respective nodal coordinates of said finished part mesh simulation are introduced separately into said fatigue analysis from said determined stresses and strains.

7. The method of claim 4, wherein fatigue strength and fatigue life of said fatigue analysis are estimated by $$\sigma_a = \sigma_L + \exp\left(\frac{\ln(a_{ECD}N_f) - C_0}{C_1}\right)$$

wherein $C_0$ and $C_1$ are material-dependent empirical constants, $a_{ECD}$ is an equivalent circle diameter of a defect or pore formed in said casting, $N_f$ is fatigue life, $\sigma_a$ is the applied stress and $\sigma_L$ is an infinite life fatigue strength of said casting that is estimated by $$\sigma_L = \frac{\Delta K_{eff,th}}{2Y(a_{ECD})U_R(a_{ECD})\sqrt{\pi a_{ECD}}}$$

where $Y(a_{ECD})$ is a geometry correction factor, $U_R(a_{ECD})$ is a crack closure correction and $K_{eff,th}$ is an effective threshold stress intensity factor of a material used in said casting.

8. The method of claim 7, wherein said infinite life fatigue strength $\sigma_L$ follows a Weibull distribution given by $$P = 1 - \exp\left(\frac{-\sigma_L}{\sigma_0}\right)^\beta$$

where P is a probability of failure at an infinite number of cycles, and $\sigma_0$ and $\beta$ are Weibull parameters for the distribution of said infinite life fatigue strength $\sigma_L$.

9. The method of claim 8, wherein said equivalent circle diameter $a_{ECD}$ follows a generalized extreme value distribution according to $$F(a_{ECD}) = \exp\left\{-\left[1 + \xi\left(\frac{a_{ECD} - \mu}{\mu_0}\right)\right]^{-1/\xi}\right\}$$

where $\mu$ is a location parameter, $\mu_0$ is a scale parameter and $\xi$ is a shape parameter.

10. The method of claim 1, wherein said algorithm that corrects for nodewise differences in said received material property information employs a first equation for said high dendrite arm spacing number region and an second equation for said low dendrite arm spacing number region.

11. The method of claim 10, wherein said first equation is represented by $$P = \frac{\rho_2}{\delta_2^b} D^b$$

and said second equation is represented by $$P = \frac{\rho_2}{\delta_2^b} \delta_1^{b-1}(D - \delta_1) + \rho_1$$

wherein $\rho$ and $\delta$ represent locations within said cast component and b is represented by:

$$b = \frac{\log(\rho_2/\rho_1)}{\log(\delta_2/\delta_1)}.$$

12. The method of claim 1, wherein said cast component comprises an automotive engine component selected from the group consisting of an engine block and a cylinder head.

13. A computer-implemented method of conducting a fatigue analysis for a cast aluminum alloy component, said method comprising:
providing a computer-based system comprising an input, an output, a central processing unit and non-transitory computer-readable medium configured to receive an algorithm configured as program code embodied therein;
accepting nodal information from a casting simulation of said cast component into said system;
accepting material property information from a material property database into said system;
using said system to determine values for at least one of solidification rate and solidification time for said accepted material property information at each node of said nodal information of said casting simulation;
accepting nodal information from a finished part representation of said cast component into said system;
using said system to approximate material properties of respective nodal coordinates of said finished part nodal representation based on said determined values of said casting simulation;
using said algorithm that takes into consideration at least one of porosity and dendrite arm spacing as a way to correct errors present in said approximated material properties, said dendrite arm spacing comprising interpolating material properties between a high dendrite arm spacing number region of said cast aluminum alloy and a low dendrite arm spacing number region of said cast aluminum alloy, wherein the high dendrite arm spacing number corresponds to an upper bound dendrite arm spacing value of neighboring nodal coordinates of the region and the low dendrite arm spacing number corresponds to a lower bound dendrite arm spacing value of neighboring nodal coordinates of the region;
using said system to assign said corrected material properties to nodes within said finished part nodal representation;
using said system to input said corrected material properties into a fatigue model; and
using said system to calculate at least one fatigue value for said cast component.

14. The method of claim 13, wherein said using said system to assign said corrected material properties comprises interpolating at least one of porosity data and dendrite arm spacing data between a plurality of different locations within said cast component and correlating said interpolated data to respective ones of said nodes within said finished part nodal representation.

15. The method of claim 14, wherein said using said system to calculate at least one fatigue value for said cast component further comprises calculating at least one tensile property of the material used in said cast component such that at least one of a nodal stress and a nodal strain is used as input in said fatigue model.

16. An article of manufacture comprising a non-transitory computer usable medium having computer readable program code embodied therein for predicting a distribution of material properties of a cast alloy, said computer readable program code in said article of manufacture comprising:
computer readable program code portion for causing said computer to accept at least one of solidification rate and solidification time values that have been determined from a casting simulation calculation for said cast alloy;
computer readable program code portion for causing said computer to accept material property information for a material that corresponds to said cast alloy;
computer readable program code portion for causing said computer to allocate values corresponding to said at least one of solidification rate and solidification time to respective nodal coordinates of said casting simulation representation of said cast alloy;
computer readable program code portion for causing said computer to use said material property information and said allocated values of said at least one of solidification rate and solidification time to approximate material properties at nodal coordinates of a finished part representation of said cast alloy, said approximation comprising interpolating material properties between a high dendrite arm spacing number region of said cast component and a low dendrite arm spacing number region of said cast component, wherein the high dendrite arm spacing number corresponds to an upper bound dendrite arm spacing value of neighboring nodal coordinates of the region and the low dendrite arm spacing number corresponds to a lower bound dendrite arm spacing value of neighboring nodal coordinates of the region; and
computer readable program code portion for causing said computer to map values of said material properties from said nodal coordinates that correspond to said casting representation to nodal coordinates of said finished part representation such that said approximate material properties at each of said nodal coordinates of said finished part representation are adjusted to account for variations in said allocated values of said at least one of solidification rate and solidification time within said cast alloy.

17. The article of manufacture of claim 16, further comprising a computer readable program code portion for causing said computer to:
- deliver at least one of nodal stress analysis data and nodal strain analysis data to a fatigue prediction program; and
- deliver said mapped and adjusted material properties to said fatigue prediction program such that upon operation of said fatigue prediction program, fatigue properties of said cast alloy are determined based on said mapped and adjusted material properties.

18. The article of manufacture of claim 16, wherein said computer readable program code portion for causing said computer to allocate values corresponding to said at least one of solidification rate and solidification time comprises allocating values of at least one of dendrite arm spacing and porosity values that correspond to said at least one of solidification rate and solidification time.

* * * * *